United States Patent
Nagatomo

(10) Patent No.: US 12,047,052 B2
(45) Date of Patent: Jul. 23, 2024

(54) ACOUSTIC WAVE DEVICE

(71) Applicant: Murata Manufacturing Co., Ltd., Nagaokakyo (JP)

(72) Inventor: Shou Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 530 days.

(21) Appl. No.: 17/380,063

(22) Filed: Jul. 20, 2021

(65) Prior Publication Data

US 2021/0351758 A1 Nov. 11, 2021

Related U.S. Application Data

(63) Continuation of application No. PCT/JP2020/003170, filed on Jan. 29, 2020.

(30) Foreign Application Priority Data

Jan. 31, 2019 (JP) ................................ 2019-015022

(51) Int. Cl.
*H03H 9/02* (2006.01)
*H03H 9/13* (2006.01)

(52) U.S. Cl.
CPC ...... *H03H 9/0211* (2013.01); *H03H 9/02015* (2013.01); *H03H 9/131* (2013.01); *H03H 9/132* (2013.01)

(58) Field of Classification Search
CPC ..... H03H 9/02086; H03H 9/125; H03H 9/171
See application file for complete search history.

(56) References Cited

U.S. PATENT DOCUMENTS

| 7,884,527 | B2 * | 2/2011 | Tsutsumi | H03H 9/132 |
| | | | | 310/365 |
| 8,610,516 | B2 * | 12/2013 | Umeda | H03H 9/568 |
| | | | | 333/187 |
| 9,240,769 | B2 * | 1/2016 | Sakashita | H03H 9/132 |
| 9,608,592 | B2 * | 3/2017 | Bi | H03H 9/171 |
| 2007/0210878 | A1 | 9/2007 | Yamaguchi et al. | |
| 2023/0170874 | A1 * | 6/2023 | Yang | H03H 9/132 |
| | | | | 310/348 |

FOREIGN PATENT DOCUMENTS

| JP | 11-205074 A | 7/1999 |
| JP | 11205074 A * | 7/1999 |
| JP | 2009-055128 A | 3/2009 |
| JP | 4877966 B2 | 2/2012 |

OTHER PUBLICATIONS

Official Communication issued in International Patent Application No. PCT/JP2020/003170, mailed on Mar. 24, 2020.

* cited by examiner

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave device in which a cavity defining an acoustic reflector is formed on a first main surface side of a substrate, an excitation portion is structured above the cavity in a manner that a first electrode, a piezoelectric thin film, and a second electrode are laminated, and a periodic pattern is provided in a normal direction of a side of the excitation portion on at least one of a first extraction electrode and a second extraction electrode.

15 Claims, 7 Drawing Sheets

ACOUSTIC WAVE DEVICE

CROSS REFERENCE TO RELATED APPLICATIONS

This application claims the benefit of priority to Japanese Patent Application No. 2019-015022 filed on Jan. 31, 2019 and is a Continuation Application of PCT Application No. PCT/JP2020/003170 filed on Jan. 29, 2020. The entire contents of each application are hereby incorporated herein by reference.

BACKGROUND OF THE INVENTION

1. Field of the Invention

The present invention relates to an acoustic wave device including an excitation portion on an acoustic reflector.

2. Description of the Related Art

Acoustic wave devices including an acoustic reflector have been generally known. In the acoustic wave device described in Japanese Patent No. 4877966 below, for example, a concave portion is formed on an upper surface of a supporting substrate. A multilayer body is provided on the supporting substrate. The multilayer body includes a lower electrode, a piezoelectric thin film, and an upper electrode. The lower electrode and the upper electrode are mutually overlapped with the piezoelectric thin film interposed therebetween, above the concave portion. In this configuration, a cavity which is formed by the concave portion defines an acoustic reflector.

In acoustic wave devices as the one described in Japanese Patent No. 4877966, a portion in which a lower electrode and an upper electrode are opposed to each other above a cavity serves as an excitation portion. The lower electrode and the upper electrode are joined to an extraction electrode used for electrical connection with an outside. Here, a lower electrode and an upper electrode sometimes extend to an outside of a cavity over a region above the cavity due to a manufacturing error or the like. In this case, the lower electrode and the upper electrode are mutually opposed with a piezoelectric thin film interposed therebetween in an outside region of the cavity. Therefore, a voltage is applied to the piezoelectric thin film also in this opposing portion, generating vibration. Accordingly, the vibration generated in the opposing portion is sometimes leaked to the extraction electrode joined to the lower electrode or the upper electrode.

If a leakage mode is thus propagated to the extraction electrode, spurious components may be generated in the acoustic wave device.

SUMMARY OF THE INVENTION

Preferred embodiments of the present invention provide acoustic wave devices that are each able to reduce or prevent leakage mode propagation.

An acoustic wave device according to a preferred embodiment of the present invention includes a substrate that includes a first main surface, a first electrode on the first main surface of the substrate, a piezoelectric thin film on the first main surface of the substrate and covering at least a portion of the first electrode, a second electrode on the piezoelectric thin film and including a portion which is opposed to the first electrode with the piezoelectric thin film interposed therebetween, and an acoustic reflector on the substrate. The first electrode is laminated on an upper surface of the acoustic reflector. A portion in which the first electrode and the second electrode are opposed to each other with the piezoelectric thin film interposed therebetween above the acoustic reflector is an excitation portion. The acoustic wave device further includes a first extraction electrode and a second extraction electrode. The first extraction electrode is joined to the first electrode and extends from the excitation portion to an exterior of the excitation portion. The second extraction electrode is joined to the second electrode and extends from the excitation portion to the exterior of the excitation portion. A periodic pattern is provided along a direction separating from the excitation portion on at least one of the first extraction electrode and the second extraction electrode.

Acoustic wave devices according to the preferred embodiments of the present invention are each able to reduce or prevent leakage mode propagation toward at least one of the first extraction electrode and second extraction electrode.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

The present invention is explained below by describing specific preferred embodiments of the present invention with reference to the accompanying drawings.

Each of the preferred embodiments described in this specification is provided as an example, and partial substitutions or combinations of features may be implemented between different preferred embodiments.

Figure 1:
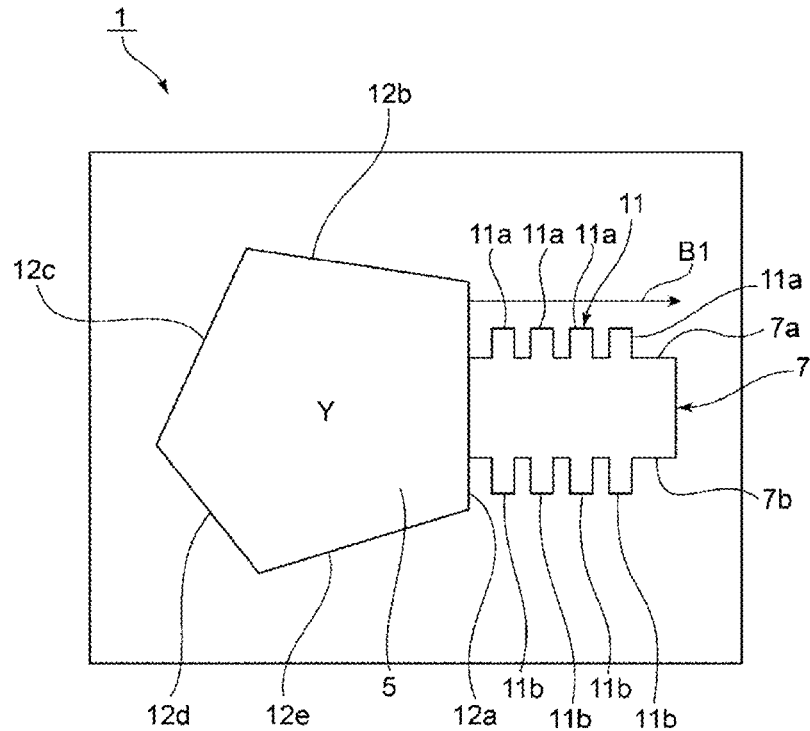
FIG. 1 is a plan view of an acoustic wave device according to a first preferred embodiment of the present invention.
Figure 2:
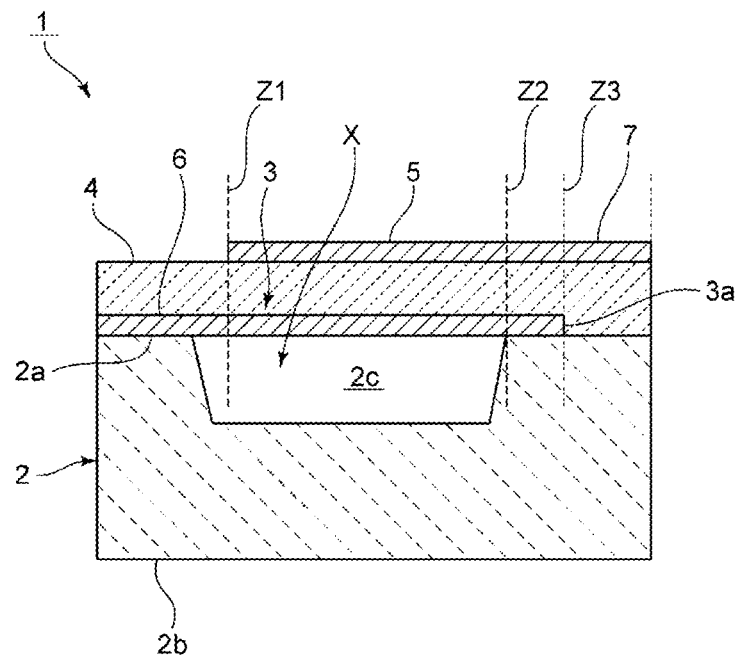
FIG. 2 is a front sectional view showing portions of the acoustic wave device according to the first preferred embodiment of the present invention.

FIG. 1 is a plan view of an acoustic wave device according to a first preferred embodiment of the present invention, and FIG. 2 is a front sectional view showing portions of the acoustic wave device.

An acoustic wave device 1 includes a substrate 2. The substrate 2 is made of insulation ceramics, for example, alumina or silicon. The material of the substrate 2 is not particularly limited. The substrate 2 includes a first main surface 2a and a second main surface 2b. A concave portion 2c is provided on the first main surface 2a. The concave portion 2c includes a cavity X that defines an acoustic reflector.

A first electrode 3 is provided on the first main surface 2a. The first electrode 3 extends above the concave portion 2c. An end portion 3a of the first electrode 3 extends to an outside region of the concave portion 2c over the concave portion 2c. A piezoelectric thin film 4 is laminated to cover at least a portion of the first electrode 3. A second electrode 5 is provided on the piezoelectric thin film 4. The second electrode 5 includes a portion opposed to the first electrode 3 with the piezoelectric thin film 4 interposed therebetween.

The laminate of the first electrode 3 and the piezoelectric thin film 4 closes the concave portion 2c, to provide the cavity X. The cavity X defines and functions as an acoustic reflector.

Above the cavity X, a portion in which the first electrode 3 and the second electrode 5 are opposed to each other with the piezoelectric thin film 4 interposed therebetween is an excitation portion Y. When an AC electric field is applied to the first electrode 3 and the second electrode 5, the piezoelectric thin film 4 expands and contracts and an acoustic wave is excited. In the first preferred embodiment, an acoustic wave in a thickness slip mode or thickness extension mode, for example, is excited as an acoustic wave. That is, the acoustic wave device 1 is a BAW device utilizing one of these modes.

The materials of the first electrode 3 and the second electrode 5 are not particularly limited. Examples of the materials may include metals, for example, Al, Cu, Mo, W, and Ru or alloys including these metals.

The piezoelectric thin film 4 is made of a piezoelectric material. Examples of the piezoelectric material may include a piezoelectric thin film material, for example, aluminum nitride, zinc oxide, and piezoelectric zirconate titanate (PZT), and a single crystal of lithium niobate or lithium tantalate. Aluminum nitride may be doped with other elements. As an element to dope aluminum nitride, at least one rare earth element selected from the group of scandium, yttrium, lanthanum, and erbium may be included.

The first electrode 3 and the second electrode 5 are electrically connected to an exterior of the acoustic wave device 1 to apply a voltage to a portion between the first electrode 3 and the second electrode 5. To provide an electrical connection, a first extraction electrode 6 and a second extraction electrode 7 are respectively joined to the first electrode 3 and the second electrode 5.

The first and second extraction electrodes 6 and 7 are made of the same or substantially the same material as the first electrode 3 and second electrode 5. Preferably, the first and second extraction electrodes 6 and 7 are integrally formed with the first and second electrodes 3 and 5, respectively, with the same material.

In FIG. 2, a portion between a dashed line Z1 and a dashed line Z2 is the excitation portion Y described above.

The excitation portion Y preferably has a larger area on the cavity X in the acoustic wave device 1, for example, and the first electrode 3 extends to the end portion of the cavity X. To make the first electrode 3 securely extend to the end portion of the cavity X, the end portion 3a may be extended over the cavity X to the second extraction electrode 7 side. With the end portion 3a extending over the cavity X to the second extraction electrode side, and with the piezoelectric thin film 4 interposed therebetween, a portion of the first electrode 3 from an outer peripheral edge of the cavity X to the end portion 3a is opposed to the second electrode 5 with the piezoelectric thin film 4 interposed therebetween. That is, an AC electric field is applied to the piezoelectric thin film 4 in the region between the dashed line Z2 and the dashed line Z3 in FIG. 2. Accordingly, vibration is also generated in the portion between the dashed line Z2 and the dashed line Z3 and the vibration may be propagated to the second extraction electrode 7 side as a leakage mode.

If a leakage mode is propagated to the second extraction electrode 7 side, the leakage mode appears as a spurious mode on resonance characteristics when a piezoelectric resonator is configured, for example.

The acoustic wave device 1 according to the present preferred embodiment is provided with a periodic pattern 11, thus reducing or preventing a leakage mode.

As illustrated in FIG. 1, the excitation portion Y has a pentagonal or substantially pentagonal shape in plan view, and includes five sides 12a to 12e, in the first preferred embodiment. In a normal direction B1 of one side 12a among the five sides 12a to 12e, a plurality of protrusion portions 11a and 11b are provided at intervals. More specifically, though not always limited, the second extraction electrode 7 extends in the normal direction B1 of the side 12a in the first preferred embodiment. Further, the second extraction electrode 7 includes a pair of side edges 7a and 7b. The side edges 7a and 7b extend in the normal direction B1 of the side 12a. The plurality of protrusion portions 11a are provided from the side edge 7a in the direction orthogonal or substantially orthogonal to the normal direction B1. Also on the side edge 7b, the plurality of protrusion portions 11b are provided from the side edge 7b in the direction orthogonal or substantially orthogonal to the normal direction B1. The plurality of protrusion portions 11a are located at regular intervals in the normal direction B1. The protrusion portions 11b are also located at regular intervals in the normal direction B1. Thus, the pattern 11 including the plurality of protrusion portions 11a and 11b is a periodic pattern along the normal direction B1. Here, the "periodic" state includes not only a state in which a pattern includes a plurality of protrusion portions whose intervals are all equal to each other, but also a state in which a pattern includes a plurality of protrusion portions whose intervals are different from each other within about ±20% when any one interval between protrusion portions is set as a reference.

Further, one protrusion portion 11a and one protrusion portion 11b are opposed to each other in the direction parallel or substantially parallel to the side 12a, with the second extraction electrode 7 interposed therebetween, in the present preferred embodiment. Thus, a plurality of pairs of protrusion portions, each of which includes one protrusion portion 11a and one protrusion portion 11b, are provided.

However, the plurality of protrusion portions 11a and 11b do not always have to make pairs. Also, the plurality of protrusion portions 11a and 11b extend in the direction orthogonal or substantially orthogonal to the side edges 7a and 7b, that is, the direction orthogonal or substantially orthogonal to the normal direction B1, but the protrusion portions 11a and 11b may extend in an intersecting direction other than the orthogonal or substantially orthogonal direction.

In the acoustic wave device 1, when an AC electric field is applied between the first electrode 3 and the second electrode 5, an acoustic wave in the thickness slip mode or thickness extension mode described above is excited in the excitation portion Y. Thus, the acoustic wave device 1 is able to provide resonance characteristics.

The AC electric field is also applied to the portion between the dashed line Z2 and the dashed line Z3, and a leakage mode is generated. The leakage mode is propagated in the normal direction B1 of the side 12a from the excitation portion Y toward the second extraction electrode 7. However, the propagated leakage mode is Bragg-reflected by the periodic pattern 11, and thus the propagation of the leakage mode toward the second extraction electrode 7 is able to be reduced or prevented. Accordingly, a resonator having favorable resonance characteristics is able to be provided.

The periodic pattern 11 is provided along the normal direction B1 in the first preferred embodiment. However, the pattern 11 may instead only be provided in a periodic manner on the first extraction electrode 6 and the second extraction electrode 7 in a direction separating from the excitation portion Y.

A material of the periodic pattern 11 is preferably the same metal as that of the second extraction electrode 7. However, a metal different from that of the second extraction electrode 7 may be included. Also, the second extraction electrode 7 is not limited to a metal, and a dielectric, for example, silicon oxide, may be included.

Leakage mode propagation is able to be reduced or prevented without increasing a manufacturing cost by only including the periodic pattern 11.

The plurality of protrusion portions 11a may be made of the same or substantially the same material as the second extraction electrode 7. Accordingly, the protrusion portions 11a are able to be joined to the side edge 7a as illustrated in FIG. 1. Similar features apply to the plurality of protrusion portions 11b. However, the plurality of protrusion portions 11a and 11b may be made of a material different from that of the second extraction electrode 7. Further, the thickness of the plurality of protrusion portions 11a and 11b is not particularly limited, and the thickness of the protrusion portions 11a and 11b may be equivalent to or smaller than the sum of the thickness of the piezoelectric thin film 4 and the thickness of the second extraction electrode 7. The protrusion portions 11a and 11b may even have the thickness larger than the sum of the thickness of the piezoelectric thin film 4 and the thickness of the second extraction electrode 7.

Preferably, for example, the plurality of protrusion portions 11a and 11b are integrally provided with the second extraction electrode 7 with the same material of the second extraction electrode 7. Accordingly, a manufacturing process is able to be simplified.

Figure 3:
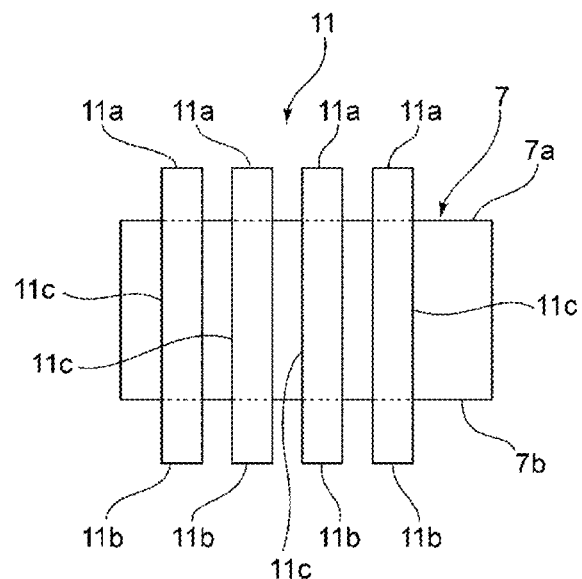
FIG. 3 is a plan view of a second extraction electrode and a periphery thereof in an acoustic wave device according to a second preferred embodiment of the present invention.

In a second preferred embodiment illustrated in FIG. 3, the protrusion portion 11a and the protrusion portion 11b are coupled with each other by a coupling portion 11c and are integrated with each other. The protrusion portion 11a and the protrusion portion 11b may be thus integrated with each other through the coupling portion 11c. Here, the coupling portion 11c is provided on the second extraction electrode 7 in FIG. 3, but the coupling portion 11c may be provided on a lower surface of the second extraction electrode 7. Accordingly, the second extraction electrode 7 may be formed after forming the pattern 11.

Figure 4:
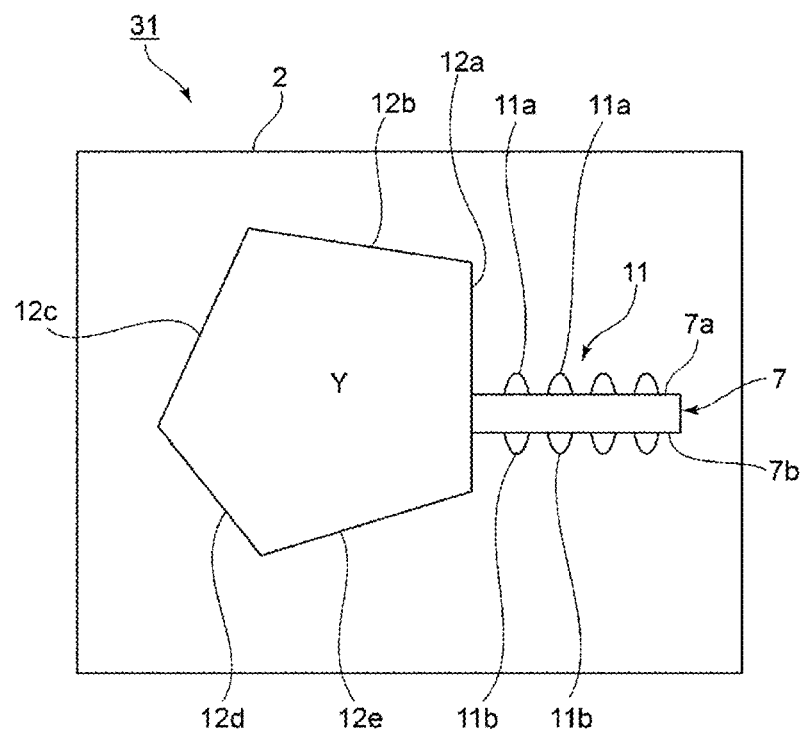
FIG. 4 is a plan view of an acoustic wave device according to a third preferred embodiment of the present invention.

FIG. 4 is a plan view of an acoustic wave device according to a third preferred embodiment of the present invention. In an acoustic wave device 31, a plurality of protrusion portions 11a and a plurality of protrusion portions 11b include an outer peripheral edge not defining a rectangle but defining a curve. In particular, the protrusion portions 11a and the protrusion portions 11b have a shape obtained by cutting out a portion of an ellipse. The protrusion portions 11a and 11b defining the pattern 11 may have a curved outer peripheral edge.

Figure 5:
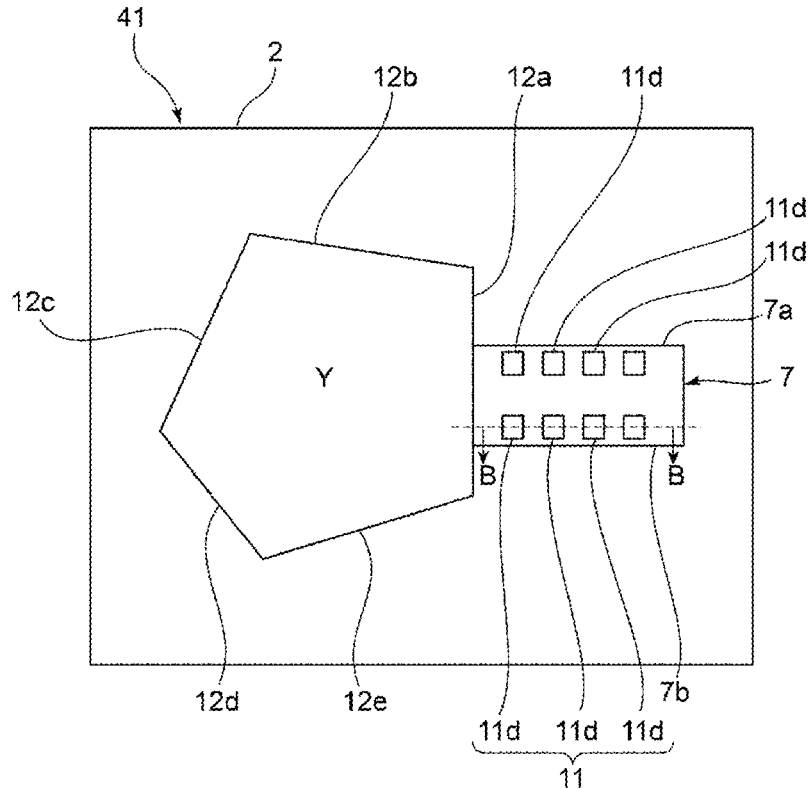
FIG. 5 is a plan view of an acoustic wave device according to a fourth preferred embodiment of the present invention.
Figure 6:
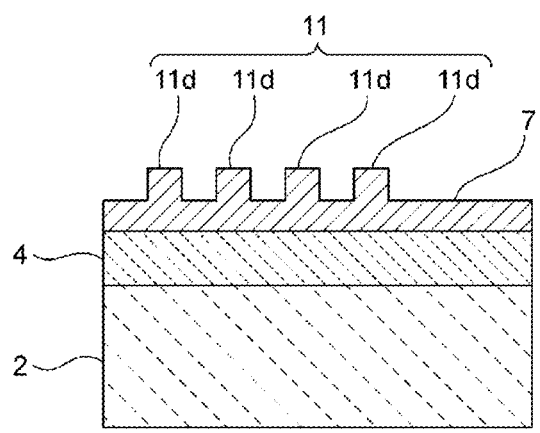
FIG. 6 is a sectional view taken along a B-B line in FIG. 5.

FIG. 5 is a plan view of an acoustic wave device according to a fourth preferred embodiment of the present invention. In an acoustic wave device 41, a plurality of convex portions 11d are provided in the second extraction electrode 7 in plan view, as illustrated in FIG. 5. The periodic pattern 11 is thus provided. FIG. 6 is a sectional view illustrating a portion taken along the B-B line of FIG. 5. As illustrated in FIG. 6, the plurality of convex portions 11d are formed to protrude upward from the second extraction electrode 7. The plurality of convex portions 11d are located at regular intervals in the normal direction of the side 12a. The periodic pattern 11 is thus formed in the normal direction.

The periodic pattern 11 may be provided by forming the convex portions 11d illustrated in FIG. 6, that is, by mass addition.

Figure 7:
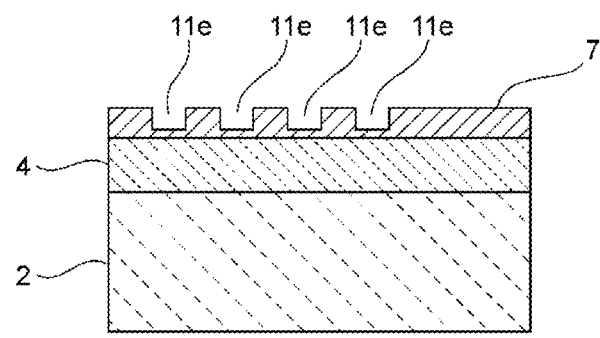
FIG. 7 is a sectional view showing a periodic pattern in an acoustic wave device according to a modification of the fourth preferred embodiment of the present invention.

FIG. 7 is a sectional view showing a periodic pattern in an acoustic wave device according to a modification of the fourth preferred embodiment of the present invention. FIG. 7 is also a sectional view of the portion corresponding to the B-B line of FIG. 5. In the fourth preferred embodiment, a plurality of concave portions 11e are formed instead of the convex portions 11d. That is, the plurality of concave portions 11e are located at regular intervals in the normal direction of the side 12a in FIG. 5. The periodic pattern 11 is thus formed. The periodic pattern may be formed by providing the concave portions 11e instead of the convex portions 11d.

A portion of the second extraction electrode 7 remains on the bottom portions of the concave portions 11e in FIG. 7. On the other hand, the bottom portions of the concave portions 11e may be positioned on the piezoelectric thin film 4. In particular, the concave portions 11e may be provided as electrode-free portions in which there are no electrode materials.

The material of the pattern 11 is preferably the same metal as that of the second extraction electrode 7, for example. However, a metal different from that of the second extraction electrode 7 may be provided for the material of the pattern 11. Also, the material of the pattern 11 is not limited to a metal, and a dielectric, for example, silicon oxide, may be included.

The features described above are able to reduce or prevent leakage mode propagation without increasing a manufacturing cost because the structure only requires that the periodic pattern 11 is provided.

In the structures provided with the convex portions 11d and the concave portions 11e, respectively illustrated in FIG. 6 and FIG. 7, periodic mismatching is provided in the second extraction electrode 7. Accordingly, leakage mode propagation is able to be more effectively reduced or prevented.

Figure 8:
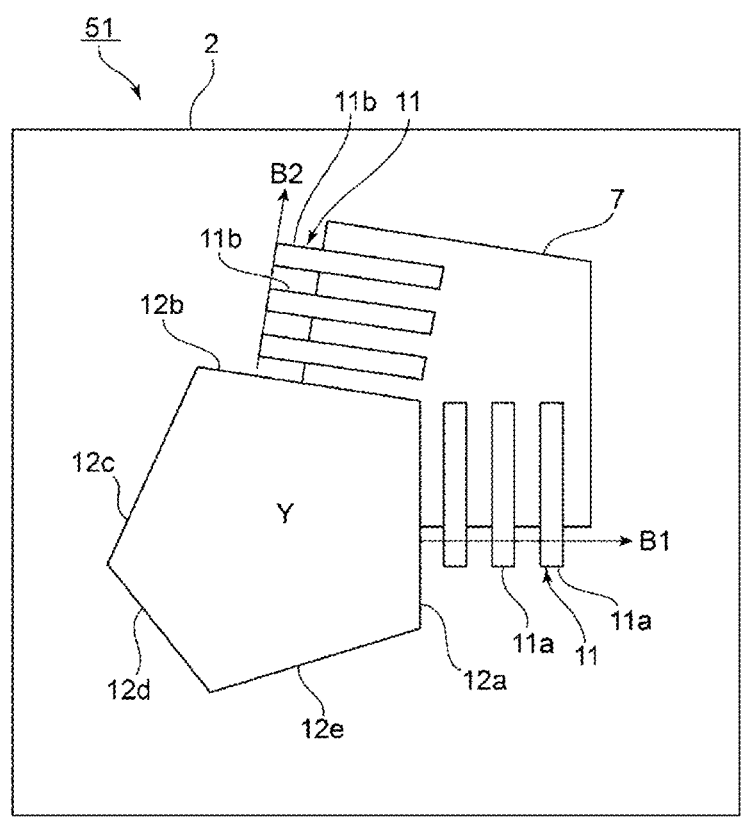
FIG. 8 is a plan view of an acoustic wave device according to a fifth preferred embodiment of the present invention.

FIG. 8 is a plan view of an acoustic wave device according to a fifth preferred embodiment of the present invention. In an acoustic wave device 51 according to the fifth preferred embodiment, the excitation portion Y has a pentagonal or substantially pentagonal shape in plan view, and includes five sides 12a to 12e, similar to the first preferred embodiment. Periodic patterns 11 are respectively provided in the normal direction B1 of the side 12a and the normal direction B2 of the side 12b, in the fifth preferred embodiment. That is, the second extraction electrode 7 is extracted from both of the side 12a and the side 12b away from the excitation portion Y. A plurality of protrusion portions 11a and a plurality of protrusion portions 11b are provided along the normal directions B1 and B2 of the sides 12a and 12b, respectively. Thus, the second extraction electrode 7 may straddle the plurality of sides 12a and 12b of the excitation portion Y having a polygonal planar shape. The periodic pattern 11 is preferably provided, for example, along both of the normal directions B1 and B2 of the side 12a and the side 12b, as the fifth preferred embodiment. An interval between the plurality of protrusion portions 11a in the normal direction B1 of the side 12a may be equal to or different from an interval between the plurality of protrusion portions 11b provided in the normal direction B2 of the side 12b. The interval or a pitch between the plurality of protrusion portions 11a and a pitch between the plurality of protrusion portions 11b, for example, may be determined with respect to acoustic characteristics of an acoustic stack and the like.

Further, the plurality of protrusion portions 11a and 11b are provided to extend to an interior of the second extraction electrode 7 in the acoustic wave device 51.

Figure 9:
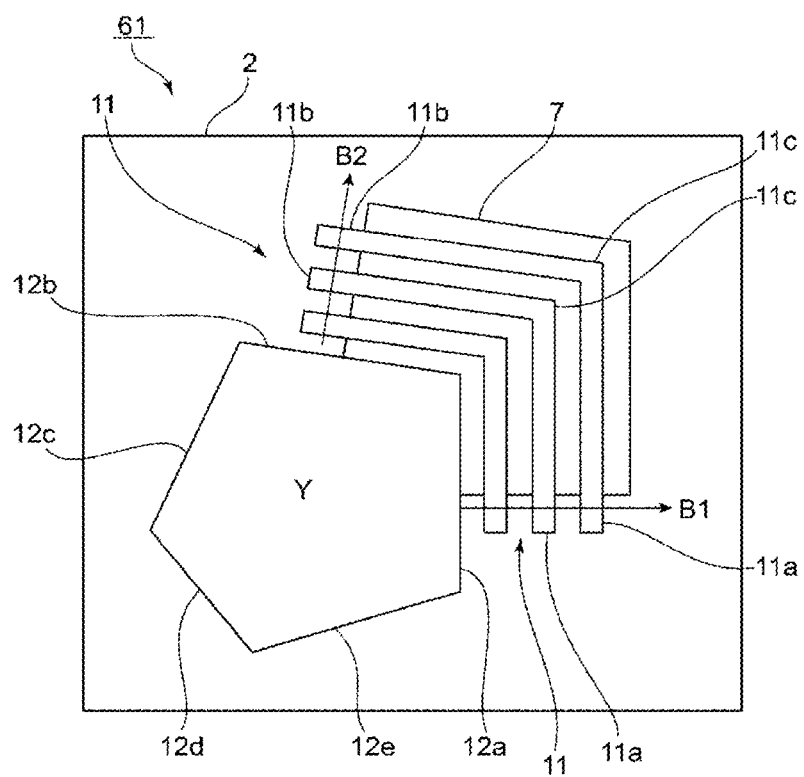
FIG. 9 is a plan view of an acoustic wave device according to a sixth preferred embodiment of the present invention.

The protrusion portion 11a and the protrusion portion 11b may be coupled with each other by the coupling portion 11c as an acoustic wave device 61, according to a sixth preferred embodiment of the present invention illustrated in FIG. 9. In the sixth preferred embodiment, the structure including the protrusion portions 11a, the coupling portions 11c, and the protrusion portions 11b is radially expanded from the excitation portion Y.

Figure 10:
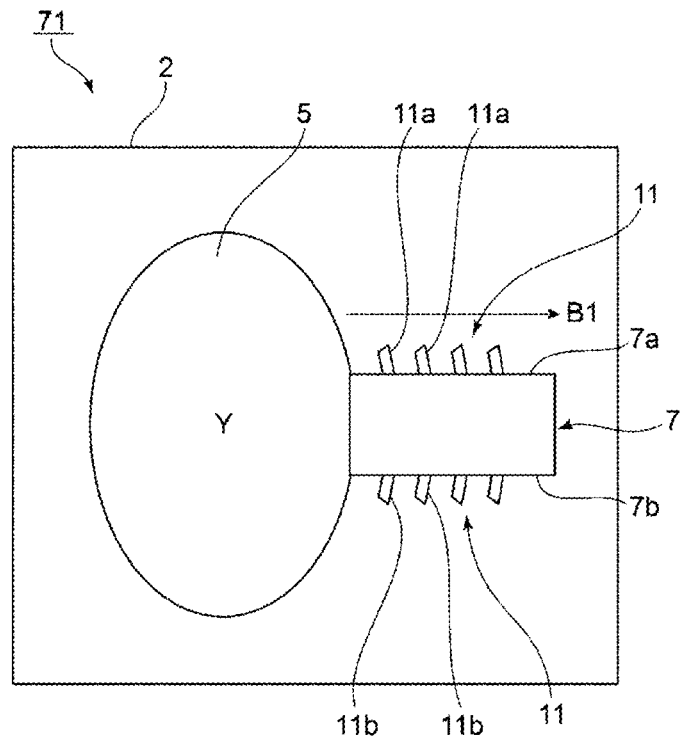
FIG. 10 is a plan view of an acoustic wave device according to a seventh preferred embodiment of the present invention.

FIG. 10 is a plan view of an acoustic wave device according to a seventh preferred embodiment of the present invention. In an acoustic wave device 71 according to the seventh preferred embodiment, the excitation portion Y has an elliptical or substantially elliptical shape in plan view. Thus, the planar shape of the excitation portion Y is not limited to a polygonal shape including a plurality of sides but may be a shape which has a curve in at least a portion thereof. The excitation portion Y has the elliptical or substantially elliptical shape, and this shape may be a shape provided by significantly increasing the number of sides of the polygonal of the excitation portion Y in the above-described preferred embodiments. Accordingly, when the second extraction electrode 7 is extended from the outer peripheral edge of the excitation portion Y to the outside, the normal direction B1 may be defined as a direction orthogonal or substantially orthogonal to a virtual line which is obtained by connecting two connection points on which the side edges 7a and 7b of the second extraction electrode 7 are connected to the excitation portion Y, as illustrated in FIG. 10. Furthermore, in the normal direction B1, the plurality of protrusion portions 11a and 11b are located at regular intervals in the normal direction B1. The periodic pattern 11 is thus provided. The structure described above also includes the periodic pattern 11 and is able to reduce or prevent leakage mode propagation as is the case with the first preferred embodiment.

Figure 11:
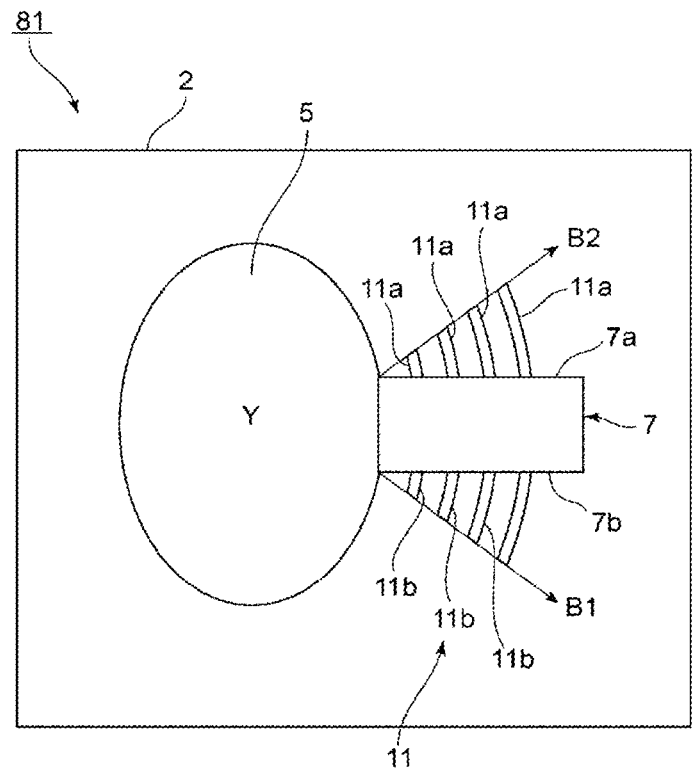
FIG. 11 is a plan view of an acoustic wave device according to an eighth preferred embodiment of the present invention.

FIG. 11 is a plan view of an acoustic wave device according to an eighth preferred embodiment of the present invention. In an acoustic wave device 81 according to the eighth preferred embodiment, the normal directions B1 and B2 are directions which are orthogonal or substantially orthogonal to tangents with respect to the outer peripheral edge of the excitation portion Y. The tangents respectively pass through contact points between the side edges 7a, 7b and the outer peripheral edge of the excitation portion Y. Further, a plurality of protrusion portions 11a and 11b, protruding from the side edges 7a and 7b of the second extraction electrode 7, are provided. The protrusion portions 11a and 11b reach virtual lines extending from the above-mentioned contact points in the normal directions B1 and B2, thus providing the radial pattern 11. The protrusion portions 11a and 11b orthogonally or substantially orthogonally intersect with the normal directions B1 and B2 respectively in the eighth preferred embodiment.

Figure 12:
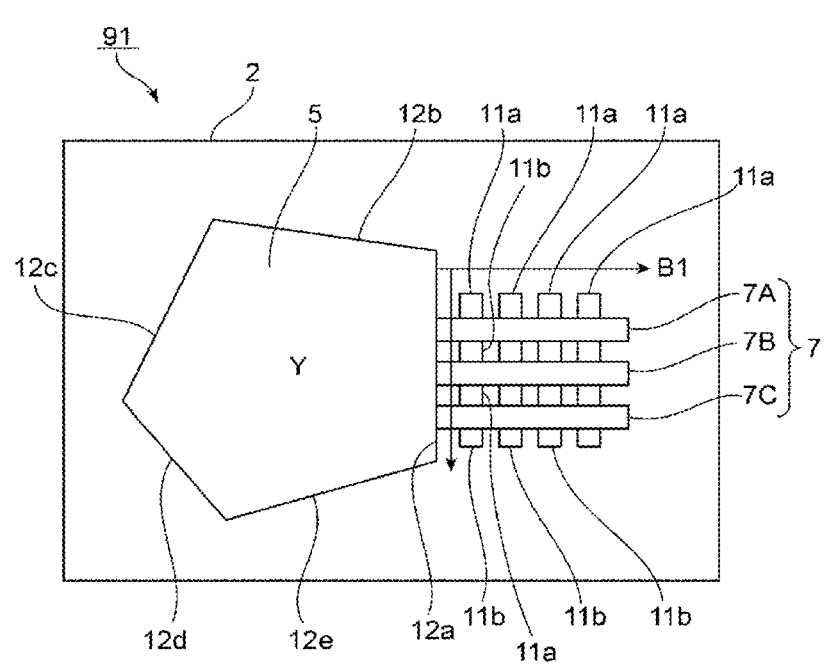
FIG. 12 is a plan view of an acoustic wave device according to a ninth preferred embodiment of the present invention.

FIG. 12 is a plan view of an acoustic wave device according to a ninth preferred embodiment of the present invention. In an acoustic wave device 91 according to the ninth preferred embodiment, the second extraction electrode 7 is divided into segment extraction portions 7A to 7C. Thus, the second extraction electrode 7 may be divided into a plurality of lines of segment extraction portions 7A to 7C. A plurality of protrusion portions 11a and 11b are provided from side edges of the segment extraction portions 7A to 7C in the direction orthogonal or substantially orthogonal, to the normal direction B1 of the side 12a. Here, a protrusion portion 11a between adjacent segment extraction portions 7B and 7C and a protrusion portion 11b between adjacent segment extraction portions 7A and 7B are provided as a single component.

In the ninth preferred embodiment, the plurality of protrusion portions 11a and 11b are located at intervals in the normal direction B1, and are able to reduce or prevent leakage mode propagation. The segment extraction portions 7A to 7C are preferably parallel or substantially parallel to the normal direction B1 and are parallel or substantially parallel to each other. The above features are able to reduce a parasitic resistance. Accordingly, an energy confinement effect of the acoustic wave device 91 is able to be improved.

Further, the segment extraction portions 7A to 7C are preferably located at regular intervals in the direction in which the side 12a extends. The structure and location of the segment extraction portions 7A to 7C provides a Bragg reflection effect not only in the normal direction B1 but also in the direction in which the side 12a extends. Accordingly, leakage mode propagation is able to be more effectively reduced or prevented. Here, the segment extraction portions 7A to 7C do not always have to be located at regular intervals. The Bragg reflection effect is able to be provided as long as the segment extraction portions 7A to 7C are located at intervals. Therefore, at least three segment extraction portions 7A to 7C are preferably provided, for example.

Figure 13:
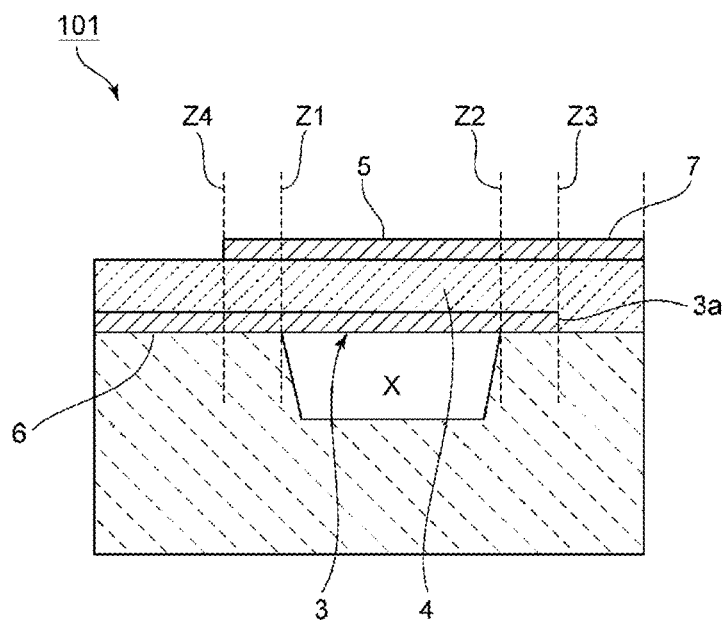
FIG. 13 is a front sectional view showing portions of an acoustic wave device according to a tenth preferred embodiment of the present invention.

FIG. 13 is a front sectional view showing portions of an acoustic wave device according to a tenth preferred embodiment of the present invention. In an acoustic wave device 101, the second extraction electrode 7 extends to the first extraction electrode 6 side over the cavity X. Therefore, vibration is also generated in a portion between dashed lines Z4 and Z1 on the first extraction electrode 6 side of the excitation portion Y, generating a leakage mode. In this case, the periodic pattern 11 may be provided on the first extraction electrode 6. In particular, in the acoustic wave device 101 according to the tenth preferred embodiment, the periodic pattern 11 is provided to both of the first extraction electrode 6 and the second extraction electrode 7 and thus, leakage mode propagation is able to be reduced or prevented on both sides.

In FIG. 13, when the end portion 3a of the first electrode 3 is positioned in the cavity X, the periodic pattern 11 does not have to be provided on the second extraction electrode 7 side.

The periodic pattern 11 is provided on at least one of the first extraction electrode 6 and the second extraction electrode 7, as described above.

Figure 14:
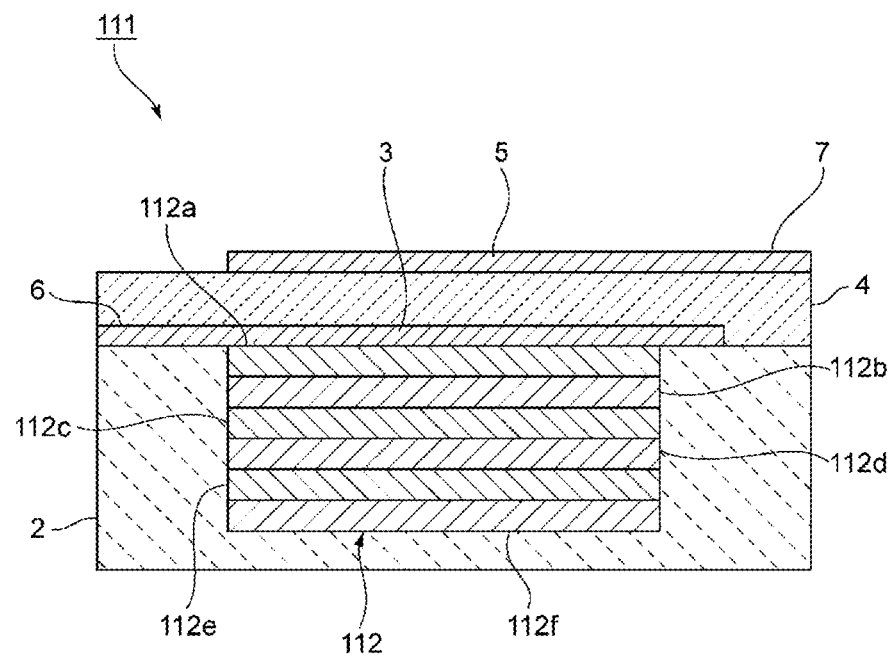
FIG. 14 is a front sectional view showing portions of an acoustic wave device according to an eleventh preferred embodiment of the present invention.

FIG. 14 is a front sectional view showing portions of an acoustic wave device according to an eleventh preferred embodiment of the present invention. In an acoustic wave device 111, an acoustic Bragg reflector 112 is provided instead of the cavity X. The acoustic Bragg reflector 112 defines and functions as an acoustic reflector. The acoustic Bragg reflector 112 has a structure provided by alternately laminating low acoustic impedance material layers 112a, 112c, and 112e and high acoustic impedance material layers 112b, 112d, and 112f. The low acoustic impedance material layers 112a, 112c, and 112e have a relatively low acoustic impedance, and the high acoustic impedance material layers 112b, 112d, and 112f have a relatively high acoustic impedance. Thus, the present invention may employ an acoustic Bragg reflector obtained by laminating low acoustic impedance material layers and high acoustic impedance material layers as an acoustic reflector. The above features do not particularly limit the numbers of laminated layers of low acoustic impedance material layers and high acoustic impedance material layers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a substrate that includes a first main surface;
   a first electrode on the first main surface of the substrate;
   a piezoelectric thin film on the first main surface of the substrate and covering at least a portion of the first electrode;
   a second electrode on the piezoelectric thin film and including a portion opposed to the first electrode with the piezoelectric thin film interposed therebetween; and
   an acoustic reflector on the substrate; wherein
   the first electrode is laminated on an upper surface of the acoustic reflector;
   a portion in which the first electrode and the second electrode are opposed to each other with the piezoelectric thin film interposed therebetween above the acoustic reflector is an excitation portion;
   the acoustic wave device further includes:
      a first extraction electrode joined to the first electrode and extending from the excitation portion to an exterior of the excitation portion; and
      a second extraction electrode joined to the second electrode and extending from the excitation portion to the exterior of the excitation portion; and
   a first periodic pattern is provided along a first direction extending away from the excitation portion on one of the first extraction electrode and the second extraction electrode and a second periodic pattern is provided along a second direction extending away from the excitation portion on the one of the first extraction electrode and the second extraction electrode, each of the first and second directions are orthogonal or substantially orthogonal to tangents with respect to an outer peripheral edge of the excitation portion, and the first direction intersects with the second direction.

2. The acoustic wave device according to claim 1, wherein the excitation portion has a polygonal shape in plan view, the polygonal shape including a plurality of sides; and
   each of the first direction and the second direction is a normal direction of a side among the plurality of sides of the excitation portion.

3. The acoustic wave device according to claim 2, wherein the polygonal shape is a pentagonal or substantially pentagonal shape.

4. The acoustic wave device according to claim 1, wherein the excitation portion has a shape with an outer peripheral edge that is curved in plan view; and
   each of the first direction and the second direction is a normal direction with respect to a virtual line, the virtual line being provided by connecting two connection points connected to the excitation portion.

5. The acoustic wave device according to claim 1, wherein each of the first periodic pattern and the second period pattern includes a plurality of protrusion portions that protrude from the one of the first extraction electrode and the second extraction electrode in a direction intersecting with a direction in which the one of the first extraction electrode and the second extraction electrode extends.

6. The acoustic wave device according to claim 5, wherein the plurality of protrusion portions are joined to the one of the first extraction electrode and the second extraction electrode.

7. The acoustic wave device according to claim 5, further comprising:
   a coupling portion coupling the plurality of protrusion portions of the first period pattern and the second period pattern with each other.

8. The acoustic wave device according to claim 1, wherein each of the first periodic pattern and the second period pattern includes convex portions or concave portions that are located at intervals in the first and second directions respectively.

9. The acoustic wave device according to claim 1, wherein the acoustic reflector is a cavity.

10. The acoustic wave device according to claim 1, wherein the acoustic reflector is an acoustic Bragg reflector including a low acoustic impedance material layer and a high acoustic impedance material layer that are laminated, the low acoustic impedance material layer having a lower acoustic impedance than the high acoustic impedance material layer.

11. The acoustic wave device according to claim 1, wherein the acoustic wave device is a BAW device.

12. The acoustic wave device according to claim 1, wherein
   the first electrode is electrically connected to an exterior of the acoustic wave device by the first extraction electrode; and
   the second electrode is electrically connected to the exterior of the acoustic wave device by the second extraction electrode.

13. The acoustic wave device according to claim 1, wherein
   the first extraction electrode includes a same material as the first electrode; and the second extraction electrode includes a same material as the second electrode.

14. The acoustic wave device according to claim 1, wherein an end portion of the first electrode at least partially extends over the upper surface of the acoustic reflector.

15. The acoustic wave device according to claim 1, wherein a periodic pattern is provided along a direction extending away from the excitation portion on the other one of the first extraction electrode and the second extraction electrode.

* * * * *